United States Patent
Yeh et al.

(10) Patent No.: US 12,520,623 B2
(45) Date of Patent: Jan. 6, 2026

(54) LED CHIP STRUCTURE AND DISPLAY DEVICE

(71) Applicant: Xiamen San'an Optoelectronics Co., Ltd., Fujian (CN)

(72) Inventors: Menghsin Yeh, Fujian (CN);
Zhousheng Jiang, Fujian (CN);
Bingyang Chen, Fujian (CN);
Chungying Chang, Fujian (CN)

(73) Assignee: Xiamen San'an Optoelectronics Co., Ltd., Fujian (CN)

( * ) Notice: Subject to any disclaimer, the term of this patent is extended or adjusted under 35 U.S.C. 154(b) by 456 days.

(21) Appl. No.: 18/155,763

(22) Filed: Jan. 18, 2023

(65) Prior Publication Data

US 2023/0246123 A1    Aug. 3, 2023

(30) Foreign Application Priority Data

Jan. 29, 2022    (CN) .......................... 202210109891.9

(51) Int. Cl.
*H10H 20/812*    (2025.01)
*H10H 20/825*    (2025.01)

(52) U.S. Cl.
CPC ........ *H10H 20/812* (2025.01); *H10H 20/825* (2025.01)

(58) Field of Classification Search
None
See application file for complete search history.

(56) References Cited

U.S. PATENT DOCUMENTS

2011/0187294 A1*    8/2011    Bergmann ........... H10H 20/811
315/363

FOREIGN PATENT DOCUMENTS

CN    109755362 A    *    5/2019

OTHER PUBLICATIONS

English translation of CN109755362A (Year: 2019).*

* cited by examiner

*Primary Examiner* — Bradley Smith
(74) *Attorney, Agent, or Firm* — JCIPRNET (57) ABSTRACT

An LED chip and a display device are disclosed in the disclosure. The LED chip structure includes a semiconductor stack layer. The semiconductor stack layer includes an N-type semiconductor layer, an active layer, and a P-type semiconductor layer. The active layer is disposed above the P-type semiconductor layer. The active layer includes multiple layers formed by repeatedly stacking a well layer and a quantum barrier layer. The P-type semiconductor layer is disposed above the active layer. The N-type peak doping concentration of at least two quantum barrier layers of the active layer is no greater than 4E17 atoms/cm$^3$.

18 Claims, 6 Drawing Sheets

LED CHIP STRUCTURE AND DISPLAY DEVICE

CROSS-REFERENCE TO RELATED APPLICATION

This application claims the priority benefit of China application serial no. 202210109891.9, filed on Jan. 29, 2022. The entirety of the above-mentioned patent application is hereby incorporated by reference herein and made a part of this specification.

BACKGROUND

Technical Field

The disclosure relates to the technical field of semiconductor elements, and particularly to an LED chip and a display device.

Description of Related Art

Mini-sized light-emitting diode (hereinafter referred to as Mini-LED) technology is widely applied in backlight display. The technology can implement more precise dynamic backlight effect, and while the brightness and contrast of the screen are effectively improved, glare resulting from the conventional dynamic backlight between the bright and dark areas of the screen can be further reduced. However, the concentration of the silicon doped layer of the quantum barrier layer in the quantum well layer of the conventional chip epitaxial structure is as high as 5E17 atoms/cm$^3$ or more, which can reduce the voltage and improve the ESD performance. However, when applied to Mini-LED, it is found that the capacitance is too high and the charge storage capacity is strong, which may affect the performance when applied to backlight display or RGB display. For example, display lag and dimming are prone to take place, resulting in poor user experience.

SUMMARY

The disclosure provides an LED chip structure, including a semiconductor stack layer, and the semiconductor stack layer includes the followings.

An N-type semiconductor layer is disposed.

An active layer is disposed above the N-type semiconductor layer, and the active layer includes multiple layers formed by repeatedly stacking a well layer and a quantum barrier layer.

A P-type semiconductor layer is disposed above the active layer.

N-type peak doping concentration of at least two quantum barrier layers of the active layer is no greater than 4E17 atoms/cm$^3$.

As mentioned, the LED epitaxial structure, the LED chip, and the display device of the disclosure at least have the following beneficial effects.

In the LED epitaxial structure of the disclosure, the N-type doping concentration of at least two layers of the active layer is no greater than 4E17 atoms/cm$^3$. By reducing and controlling the N-type doping concentration of at least some layers of the active layer, the capacitance of the active layer in the epitaxial structure is further reduced, and the problem of display lag and dimming is solved when it is applied to backlight display.

DESCRIPTION OF THE EMBODIMENTS

Note that the doping concentration of each layer included in the disclosure can be analyzed by any suitable means, such as a secondary ion mass spectrometer (SIMS). In the disclosure, the peak doping concentration includes the highest concentration value between two segments of line having slopes with opposite signs to each other in the obtained analytical spectrum. The segments of line having slopes with opposite signs to each other mean that the slope of one segment is a positive value, and the slope of the other segment is a negative value.

Embodiment 1

The embodiment provides an LED chip structure, including an LED epitaxial structure.

Figure 1:
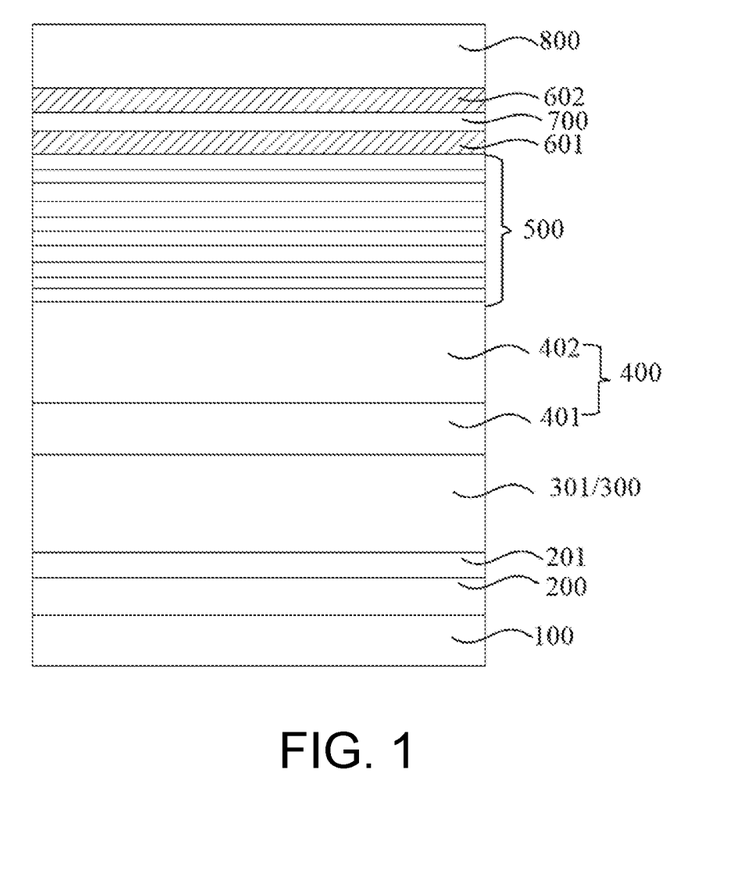
FIG. 1 is a schematic structural view of the LED epitaxial structure according to Embodiment 1 of the disclosure.

Specifically, referring to FIG. 1, the LED epitaxial structure includes a growing substrate 100, a buffer layer 200, and an undoped GaN layer 201 in sequence. The growing substrate 100 may be made of conductive material or insulating material, and the material may be one of sapphire, aluminum nitride, GaN, and silicon nitride.

The most common substrate configured for an LED epitaxial structure is sapphire substrate, the thickness of the sapphire substrate is between 60 and 150 nm, and the sapphire substrate is a PSS substrate. That is, aluminum oxide convex patterns in a uniform size and at a uniform interval are formed on the surface of the sapphire substrate through an etching process, or part of the height of the aluminum oxide convex patterns may be replaced by a material with a lower refractive index relative to aluminum oxide.

The lattice constant of the buffer layer 200 is between the growing substrate 100 and an N-type semiconductor layer 300, and the buffer layer 200 may be an AlN layer, a GaN layer, or an AlGaN layer, and the like to reduce the lattice mismatch between the growing substrate 100 and the N-type semiconductor layer 300. In the embodiment, the growing substrate 100 is a sapphire substrate, and the buffer layer 200 is an undoped GaN layer. Optionally, the undoped GaN layer 201 is further disposed above the buffer layer 200.

The N-type semiconductor layer 300 is grown above the undoped GaN layer 201, and the N-type semiconductor layer 300 provides electrons by intentionally doping N-type impurities, which may be Si, Ge, Sn, Se, and Te. In the embodiment, the N-type impurity is Si, and the N-type semiconductor layer 300 is an N—GaN layer. Optionally, the peak doping concentration of N—GaN is between 1E18 atoms/cm$^3$ and 1E20 atoms/cm$^3$. The N-type semiconductor layer 300 includes a first N-type GaN layer 301. The first N-type GaN layer 301 aims at providing electrons and providing an electrical contact layer for the N-type electrode of the light emitting diode. The doping concentration of the first N-type GaN layer is between 5E18 atoms/cm$^3$ and 5E19 atoms/cm$^3$. The thickness is set to be 1 μm or more, for example, 1 to 10 and preferably the thickness is not more than 3 μm.

A superlattice layer 400 is disposed above the first N-type GaN layer 301, and the stress between the N-type semiconductor layer 300 and an active layer 500 may be released during the epitaxial growth process. The superlattice layer 400 includes repeatedly stacked InGaN/GaN, the stacking period is 3-8, and the peak N-type doping concentration is between 1E17 atoms/cm$^3$ and 5E18 atoms/cm$^3$.

The active layer 500 is disposed above the superlattice layer 400, and the active layer 500 is a region where electrons and holes recombine to generate light. The active layer 500 includes quantum barrier layers and well layers alternately disposed above the superlattice layer 400 in sequence, and the alternating period of the quantum barrier layers and the well layers is between 7 pairs and 12 pairs, for example, 9-10 pairs. The quantum barrier layer is an AlGaN layer or a GaN layer, and the well layer is an InGaN layer. By adjusting the In content of InGaN, the energy level band gap may be adjusted, and the emission wavelength of the active layer may be adjusted.

In the active layer 500, each quantum barrier layer has a first energy level band gap. Each well layer has a second energy level band gap. In one embodiment, the first energy level band gap of one of the first quantum barrier layers is greater than a second energy level band gap of one of the well layers. Preferably, in an embodiment, the first energy level band gap of one of the first quantum barrier layers is greater than the second energy level band gap of one of the well layers. Each quantum barrier layer has a thickness, and each well layer has a thickness. The thickness of one of the first quantum barrier layers is greater than the thickness of one of the well layers. Preferably, the thickness of each quantum barrier layer is greater than the thickness of each well layer. Preferably, the thickness of each quantum barrier layer is no greater than 20 nm, and more preferably, no less than 3 nm. In the embodiment, the thicknesses of all quantum barrier layers are approximately the same. The thickness of each well layer is no greater than 10 nm, and more preferably, no less than 1 nm. Preferably, the thickness of each well layer is between 2 and 5 nm, and the thickness of each quantum barrier layer is between 5 and 15 nm, for example, the thickness of each quantum barrier layer is between 6 and 12 nm. In the embodiment, the thicknesses of all the well layers are approximately the same, and the thicknesses of all the quantum barrier layers are approximately the same.

To reduce the capacitance of the LED epitaxial structure, the period of the well layer and the quantum barrier layer of the active layer 500 in the embodiment is set to K pairs. Preferably K is 7-12 pairs, K is greater than 0, and K is an integer. The quantum barrier layer is a high N-type doping layer, and the well layer is a low N-type doping layer or no doping layer. Preferably, according to the backlight display or RGB field driven by a small current (driving current not exceeding 15 mA), to ensure the brightness, the number of periods of the well layer and the quantum barrier layer of the active layer is 8-10 pairs. Preferably with respect to lighting or backlighting areas used in conventional sizes, the periods of the well layer and the quantum barrier layer are increased by 2-3 pairs.

Preferably, counting starts from the side closest to the N-type semiconductor layer 300, and the active layer 500 starts with a well layer and ends with a quantum barrier layer. The active layer 500 includes at least two layers whose peak silicon doping concentration do not exceed 4E17 atoms/cm$^3$. As an embodiment, in the active layer 500, at least two layers with peak silicon doping concentration ranging from 1E17 atoms/cm$^3$ to 4E17 atoms/cm$^3$ are quantum barrier layers. Through the intentional doping relative concentration of at least some of the quantum barrier layers, the capacitance of the entire epitaxial structure can be effectively adjusted, so that the low-capacitance requirements of the backlight display driven by a small current or the RGB field can be met.

More preferably, the silicon doping concentration of each quantum barrier layer of the active layer cannot be less than 1E17 atoms/cm$^3$ to stabilize the voltage from being too high. Therefore, the doping concentration of at least two quantum barrier layers is between 1E17 atoms/cm$^3$ and 4E17 atoms/cm$^3$, for example, between 2E17 atoms/cm$^3$ and 4E17 atoms/cm$^3$, or furthermore the doping concentration of the at least two quantum barrier layers is 3E17 atoms/cm$^3$ to 4E17 atoms/cm$^3$.

Preferably, counting from the side of the active layer 500 closest to the N-type semiconductor layer 300, the at least two layers refer to at least two quantum barrier layers located in the K/2 to the Kth layer. By adjusting the silicon doping concentration of at least two quantum barrier layers closest to one side of a P-type semiconductor layer 800, the capacitance may be significantly reduced.

More preferably, the peak silicon doping concentration of each of at least half number of the quantum barrier layers ranges from 1E17 atoms/cm$^3$ to 4E17 atoms/cm$^3$. Or preferably, theoretically, the silicon doping concentration of all quantum barrier layers ranges from 1E17 atoms/cm$^3$ to 4E17 atoms/cm$^3$, but the actual SIMS test data is affected by the SIMS test method, and the last silicon doping concentration signal may be reduced to be less than 1E17 atoms/cm$^3$.

As an optional embodiment, the silicon doping concentration of partial number of the quantum barrier layers is greater than 5E17 atoms/cm$^3$. For example, some of the quantum barrier layer (at least two layers) have silicon doping concentration ranging from 1E17 atoms/cm$^3$ to 4E17 atoms/cm$^3$, the each remaining quantum barrier layers (at least one layer) has silicon doping concentration greater than 5E17 atoms/cm$^3$, and alternatively, there is one quantum barrier layer with silicon doping concentration less than 1E17 atoms/cm$^3$.

To prevent electron overflow of the active layer, an electron blocking layer is further disposed above the active layer 500, specifically, on the last quantum barrier layer of the active layer 500. The electron blocking layer may be a repeated stack of AlGaN or AlGaN/InGaN, a repeated stack of AlGaN/GaN, or an AlN layer. In the embodiment, referring to FIG. 1, the electron blocking layer includes a first electron blocking layer 601 and a second electron blocking layer 602.

In the embodiment, the first electron blocking layer 601 has an energy level band gap which is greater than the energy level band gap of the second electron blocking layer 602. The first electron blocking layer 601 includes AlgGa(1−g)N with high aluminum composition, where $0 < g \leq 1$, preferably, $0.5 < g \leq 1$, and even preferably $0.7 < g \leq 1$. The aluminum content is greater than the aluminum content of the quantum barrier layer of the active layer 500 (the aluminum content in the quantum barrier layer may also be 0). In one embodiment, the first electron blocking layer 601 includes AlN. In one embodiment, the elements gallium and aluminum are displayed on the SIMS spectrum. The signal strength of gallium at the position of the first electron blocking layer 601 is lower than the signal strength of gallium at the position of the active layer, and the signal strength of aluminum at the position of the first electron blocking layer 601 is higher than the signal strength of aluminum at the position of the active layer 500. In the embodiment, the first electron blocking layer 601 has a thickness, which is no less than 0.5 nm and no greater than 15 nm, and more preferably, no greater than 10 nm. The thickness of the first electron blocking layer 601 ranges from 0.5 nm to 15 nm (i.e., $\geq 0.5$ nm and $\leq 15$ nm). With the setting of the thickness, the diffusion of P-type dopants into the active layer 500 may be reduced. If the thickness of the first electron blocking layer 601 is less than 0.5 nm, the ability to block the diffusion of P-type dopants into the active layer 500 may be deteriorated, and the electrostatic discharge protection ability of the semiconductor element may be deteriorated. If the thickness of the first electron blocking layer 601 is greater than 15 nm, the electrical properties of the semiconductor element, such as starting voltage, leakage current, or the like may be deteriorated. More preferably, the thickness of the first electron blocking layer 601 is between 1 and 3 nm.

In the embodiment, the second electron blocking layer 602 has an energy level band gap which is lower than the energy level band gap of the first electron blocking layer 601. As an embodiment, the second electron blocking layer 602 includes AlgGa(1−g)N with high aluminum composition, where $0 < g \leq 1$, preferably $0.5 < g \leq 1$, and even preferably, $0.7 < g \leq 1$. The aluminum content is greater than the aluminum content of the quantum barrier layer of the active layer but less than the aluminum content of the first electron blocking layer 601. Preferably, the thickness of the second electron blocking layer 602 ranges from 1 nm to 50 nm. As an embodiment, the second electron blocking layer 602 includes repeatedly stacked layers of AlkGa(1−k)N/AlmInn-GaN composed of high aluminum, where $0 < k \leq 1$, preferably $0.5 < k \leq 1$, even preferably $0.7 < k \leq 1$, even preferably $0 < m < k$, and even preferably, $0 < n < m$. Preferably, the total thickness of the second electron blocking layer 602 formed by repeatedly stacking is between 10 and 150 nm.

A low temperature P-type GaN layer 700 is disposed between the first electron blocking layer 601 and the second electron blocking layer 602, and the P-type doping concentration of the low temperature P-type GaN layer 700 is greater than the P-type doping concentration of the first electron blocking layer 601 and the second electron blocking layer 602. An increase of the warpage of the wafer may be generated when the GaN layer is grown at a high temperature, so the wavelength distribution of the grown GaN may be uneven. In the embodiment, the warpage of the wafer may be reduced when GaN is grown at a low temperature, and the luminous brightness of the LED is improved. Preferably, the thickness of the low temperature P—GaN layer is between 10 and 50 nm. Optionally, the low temperature P-type GaN layer 700 may also be set as a low temperature P—AlGaN layer instead. The low temperature P—AlGaN layer may be AlpGa(1−p)N, $0 < p \leq 1$. According to the SIMS curve, the Al content of the low temperature P-type GaN layer 700 is less than the Al content of the first electron blocking layer 601 and the second electron blocking layer 602. The doping concentration of the low temperature P-type GaN layer is equal to or greater than 1E19 atoms/cm$^3$, preferably, between 5E19 atoms/cm$^3$ and 1E20 atoms/cm$^3$.

The P-type semiconductor layer 800 is formed above the second electron blocking layer 602. The P-type semiconductor layer 800 may provide holes through P-type impurities, and the P-type impurities may be Mg, Zn, Ca, Sr and Ba. In the embodiment, the P-type impurity of the P-type semiconductor layer is Mg, and the material of the P-type semiconductor layer 800 is P—GaN, the peak doping concentration is greater than or equal to 1E19 atoms/cm$^3$, and the thickness is set to between 10 nm and 500 nm. Preferably, the peak doping concentration of the P-type semiconductor layer 800 ranges from 1E19 atoms/cm$^3$ to 1E20 atoms/cm$^3$ to further improve the antistatic performance of the epitaxial structure. The doping concentration of the P-type semiconductor layer 800 may be less than the doping concentration of the low temperature P-type GaN layer 700.

The P-type semiconductor layer 800 may further include a P-type contact layer (not shown in the drawings). Compared with the conventional P-type contact layer, the P-type contact layer in the embodiment has higher P-type doping concentration. In the embodiment, the P-type contact layer is a P-type GaN layer or a P-type AlGaN layer, the P-type contact layer is located on the uppermost surface of the P-type semiconductor layer, and the doping concentration of the P-type contact layer is greater than the doping concentration of the P-type semiconductor layer 800. Preferably, the P-type is doped with Mg, and the doping concentration is greater than 1E19 atoms/cm$^3$, or preferably, greater than 1E20 atoms/cm$^3$. The thickness has a thickness no greater than 15 nm, and preferably, greater than or equal to 3 nm.

In the embodiment, the N-type peak doping concentration of at least two layers included in the active layer is set to be no greater than 4E17 atoms/cm$^3$, and the capacitance of the epitaxial structure may be reduced.

Embodiment 2

The solution of Embodiment 1 may adjust the capacitance of the active layer but with deteriorated ESD performance, so accordingly, the embodiment also provides an LED epitaxial structure, whose similarity shared with Embodiment 1 may not be repeated herein and the difference is illustrated as follows.

Figure 2:
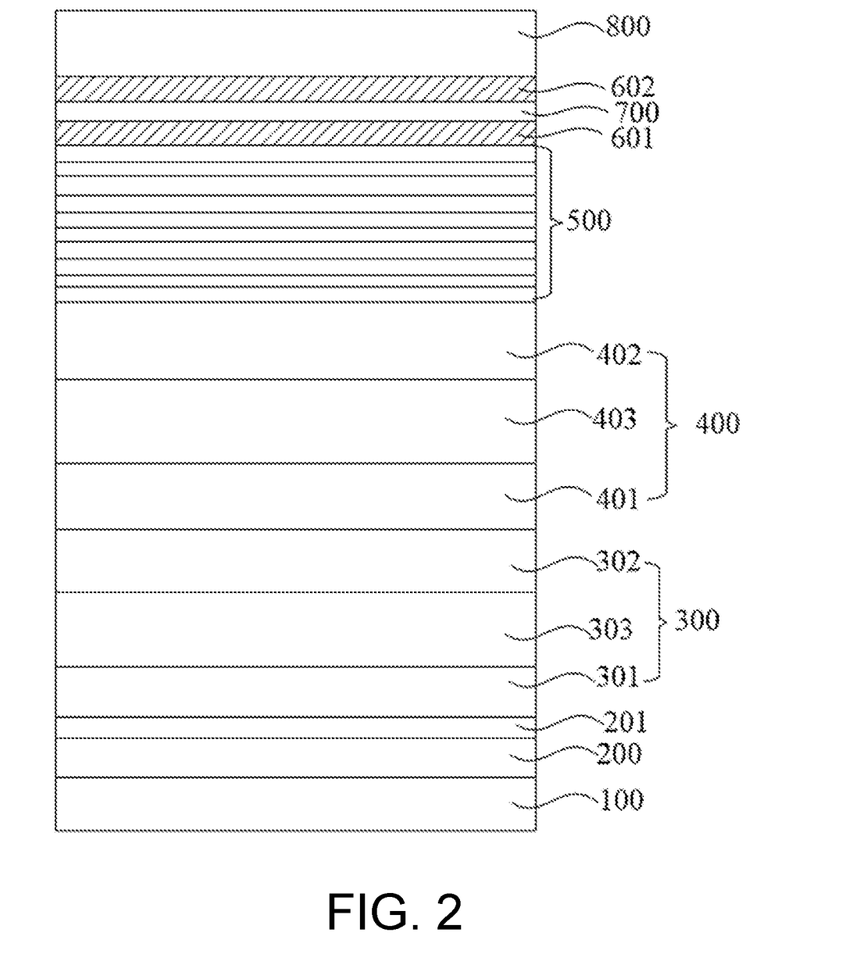
FIG. 2 is a schematic structural view of the LED epitaxial structure according to Embodiment 2 of the disclosure.

Referring to FIG. 2, the N-type nitride layer further includes a second N-type GaN layer 302. The first N-type GaN layer 301 is closer to the substrate than the second N-type GaN layer 302, the second N-type GaN layer 302 is closer to the active layer 500 than the first N-type GaN layer 301, and the peak doping concentration of the first N-type GaN layer 301 is greater than the peak doping concentration of the second N-type GaN layer 302. The peak doping concentration of the second N-type GaN layer ranges from 1E18 atoms/cm$^3$ to 1E19 atoms/cm$^3$.

In the embodiment, a third N-type GaN layer 303 is further disposed between the first N-type GaN layer 301 and the second N-type GaN layer 302, and the N-type peak doping concentration of the third N-type GaN layer 303 is less than the peak doping concentration of the first N-type GaN layer 301 and the peak doping concentration of the second N-type GaN layer 302, respectively.

By forming a low-doped third N-type GaN layer 303 between highly-doped first N-type GaN layer 301 and highly-doped second N-type GaN layer 302, the N-type semiconductor layer 300 forms a stepped high-low-high distribution structure. Such a structure may buffer high-voltage static electricity, the destructive force of high-voltage static electricity may be reduced, ESD performance may be improved, and ESD performance is further prevented from being affected by the reduction of silicon doping concentration of the quantum well layer.

In the embodiment, referring to FIG. 2, two groups of the superlattice layer 400 are included, namely a first superlattice layer 401 and a second superlattice layer 402. The second superlattice layer 402 is between the first superlattice layer 401 and the active layer 500. The first superlattice layer 401 includes a repeated stack of InGaN/GaN, and the time of repeatedly stacking is 3 to 6 times; the second superlattice layer 402 includes a repeated stack of InGaN/GaN, and the time of repeatedly stacking is 3 to 6 times. The In content in the InGaN layer of the superlattice layer 400 is less than the In content in the InGaN well layer in the active layer, so that a stress may be buffered between the N-type semiconductor layer 300 and the active layer 500. When the superlattice layer 400 is divided into the first superlattice layer 401 and the second superlattice layer 402, the In content of InGaN in the first superlattice layer 401 is less than the In content of InGaN in the second superlattice layer 402 content. The second superlattice layer 402 is closer to the active layer 500 than that of the first superlattice layer 401.

More preferably, the N-type peak doping concentration of the second superlattice layer 402 close to the N-type semiconductor layer 300 is less than the N-type peak doping concentration of the first superlattice layer 401 close to the active layer 500. In the embodiment, the N-type peak doping concentration of the superlattice layer 400 is less than the peak doping concentration of the second N-type GaN layer 302 to improve the antistatic performance of the LED.

Even preferably, to improve the ESD performance, a fourth N-type GaN layer 403 is included between the first superlattice layer 401 and the second superlattice layer 402, and the peak doping concentration of the fourth N-type GaN layer 403 is greater than the peak N-type doping concentration of the first superlattice layer 401 and the second superlattice layer 402, respectively. Also, the thickness of the third N-type GaN layer 303 is greater than the thickness of the fourth N-type GaN layer 403.

In some embodiments, a group of the superlattice layer 400 is included, that is, a repeated stack of InGaN/GaN is included, and the time of repeatedly stacking is 3-6 times. A GaN layer with high doping concentration is further included between the last InGaN layer of the superlattice layer 400 and the active layer 500, and the GaN layer with high doping concentration is defined as a fifth N-type GaN layer (not shown in the drawing). Preferably, the doping concentration of the fifth N-type GaN layer is greater than the doping concentration of the second N-type GaN layer 302 and also greater than the N-type doping concentration of the superlattice layer 400, which may function with favorable stability of the ESD performance. Preferably, the doping concentration of the fifth N-type GaN layer is greater than the doping concentration of the active layer 500.

Even preferably, to prevent the deterioration of the ESD performance resulting from the reduction of capacitance, the P-type semiconductor layer 800 is formed on the second electron blocking layer 602. In addition, the thickness of the P-type semiconductor layer 800 is significantly increased compared to the conventional lamp-type lighting application field (to improve the brightness in the conventional lamp-type lighting field, the thickness of the P-type semiconductor layer 800 is usually no greater than 10 nm to maintain the brightness). For the field of backlight, preferably the P-type semiconductor layer 800 is 20-40 nm. Although as the thickness of the P-type semiconductor layer 800 increases, the brightness may decrease, a relatively thicker P-type semiconductor layer 800 may contribute to improving the ESD performance and reliability and further ensuring the working stability of the light emitting diode. When the chip is designed to be smaller in size and applied to the field of RGB display, the higher ESD performance is required. Preferably, the P-type semiconductor layer 800 is further thickened, and the thickness is between 100-400 nm.

Embodiment 3

The embodiment also provides an LED epitaxial structure, whose similarity shared with Embodiment 1 may not be repeated herein and the difference is illustrated as follows.

Referring to FIG. 1, the mobility of electrons is greater than the mobility of holes, so an AlxIn1-xGaN layer is inserted between the superlattice layer 400 and the active layer 500, and 0<x≤1. The AlxIn1-xGaN layer may block electrons to a certain extent, the transfer rate of electrons to the active layer is slowed down, the recombination efficiency of electrons and holes in the active layer is improved, and thereby the brightness is increased, which can make up for the effect of thickening of the P-type semiconductor layer on the light efficiency. Preferably, the Al content of the AlGaN layer is greater than the Al content of the active layer, and the Al content of the AlGaN layer is less than the Al content of the first electron blocking layer 601 and the second electron blocking layer 602 between the active layer and the P-type semiconductor layer. The thickness of the AlxIn1-xGaN layer is preferably no less than 10 nm and no greater than 100 nm as well.

Embodiment 4

Figure 3:
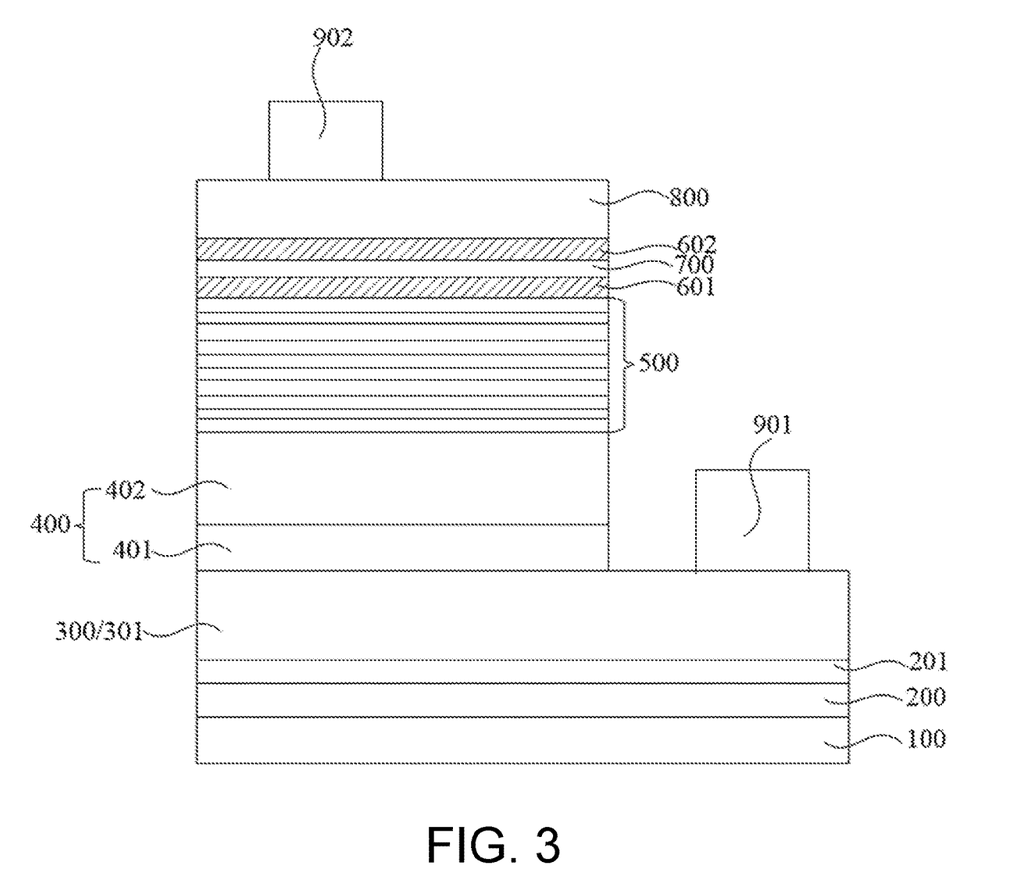
FIG. 3 is a schematic structural view of the LED chip according to Embodiment 4 of the disclosure.
Figure 4:
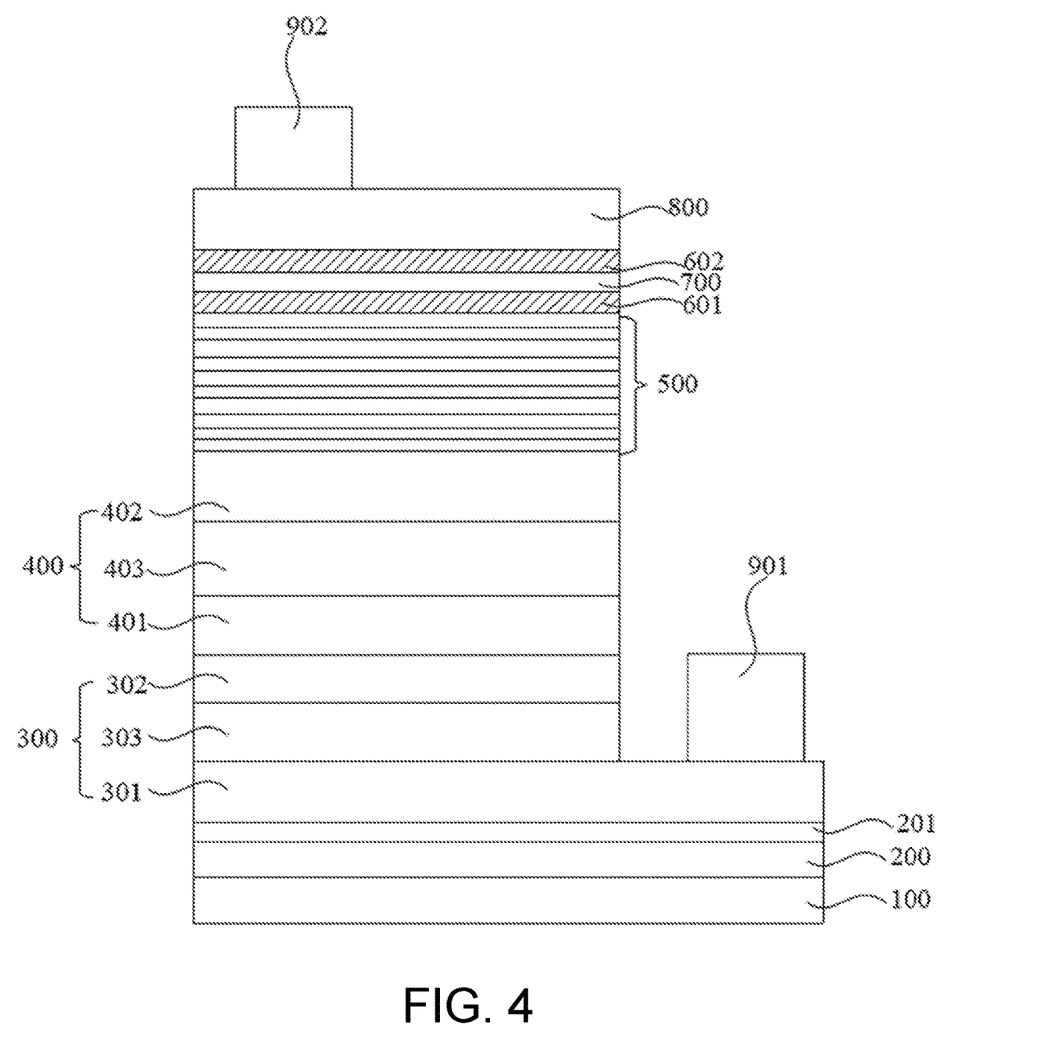
FIG. 4 is a schematic structural view of the LED chip according to Embodiment 4 of the disclosure.

An LED chip is disclosed in the embodiment. Referring to FIG. 3 or FIG. 4, the LED chip includes the LED epitaxial structure illustrated in Embodiment 1, Embodiment 2, or Embodiment 3; an N-type electrode 901; and a P-type electrode 902. The N-type electrode 901 is electrically connected to the N-type semiconductor layer 300 in the LED epitaxial structure, and the P-type electrode 902 is electrically connected to the P-type semiconductor layer 800 in the LED epitaxial structure. Optionally, the light emitted by the LED chip is blue light, and the peak wavelength of the blue light ranges from 440 nm to 460 nm.

In the embodiment, a P-type contact layer (not shown in the drawing) is disposed on the surface of the P-type semiconductor layer 800, and a transparent electrode layer (not shown in the drawing) is also disposed on the P-type contact layer. Preferably, the transparent electrode layer is ITO or GTO. The P-type electrode 902 is disposed on the transparent electrode layer and electrically connected to the P-type semiconductor layer 800 through the transparent electrode layer and the P-type contact layer. The N-type electrode 901 is formed on the surface of the N-type semiconductor layer 300 and electrically connected to the N-type semiconductor layer 300.

In the embodiment, the LED chip may be a front chip or a flip chip, and the front chip, the chip, and the flip chip may be a chip with a single light-emitting area or a chip with two or more light-emitting areas. Preferably, the LED chip may be processed into a small-sized light-emitting chip (the size of one side is less than 300 µm, and the total light-emitting area is less than 200,000 µm$^2$) and may be applied to the field in which light emission is driven by a small current (less than or equal to 15 mA), such as the field of liquid crystal display backlight or the field of RGB display.

Embodiment 5

The embodiment further provides a display device, including the LED chip illustrated in Embodiment 4. The LED chip serves as a backlight source chip of a backlight module of a display device or a blue light source chip of an RGB display module and is capable of effectively improving the display lag and dimming.

In the subsequent paragraphs, tests on three flip-chips (chips with lengths of 200/200 µm on the adjacent sides and with the peak emission wavelength ranging from 440 nm and 460 nm) that can be applied in the field of backlight are illustrated. The peak of all the quantum barrier layers of the active layer of one of the flip chips is 9.5E16 atoms/cm$^3$, the peak of all the quantum barrier layers of the active layer of another one of the flip chips is 2.5E17 atoms/cm$^3$, and the peak of all the quantum barrier layers of the active layer of yet another one of the flip chips is 4.5E17 atoms/cm$^3$. In addition, all epitaxial structures of the three chips have the P-type semiconductor layer 800 with a thickness of 25 nm. Capacitance, voltage, and electrostatic performance of the three flip-chips each are tested, and the obtained curve comparison charts are shown as FIG. 5 and FIG. 6.

Figure 5:
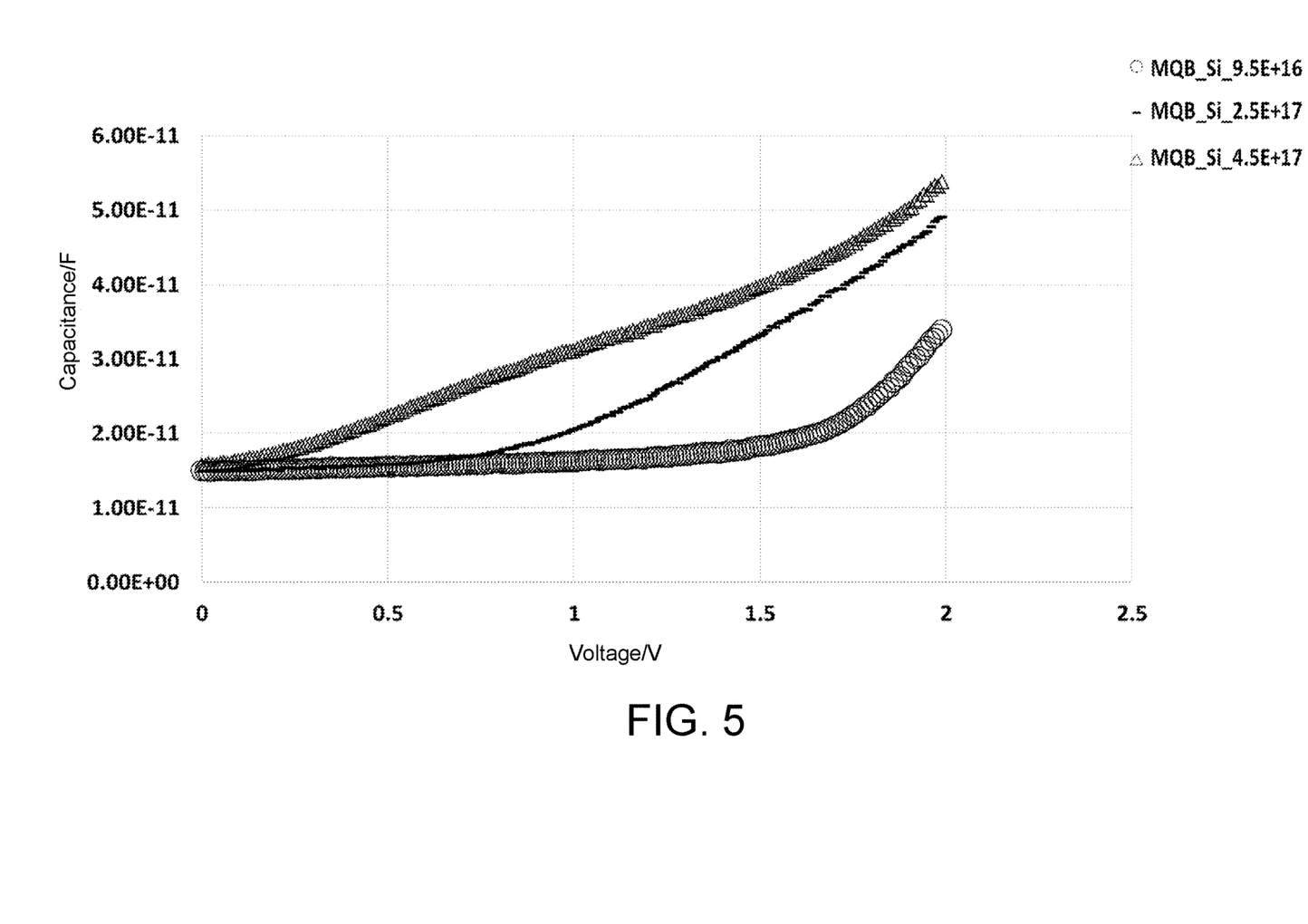
FIG. 5 illustrates a capacitance-voltage curve comparison of the LED chips with silicon doping concentration of 9.5E16 atoms/cm$^3$ of all quantum barrier layers of the active layer close to the P-type semiconductor layer, the LED chips with a peak silicon doping concentration of 2.5E17 atoms/cm$^3$ of all quantum barrier layers of the active layer close to the P-type semiconductor layer, and the LED chips with the peak silicon doping concentration of 4.5E17 atoms/cm$^3$ of all quantum barrier layers of the active layer close to the P-type semiconductor layer in the embodiment of the disclosure.
Figure 6:
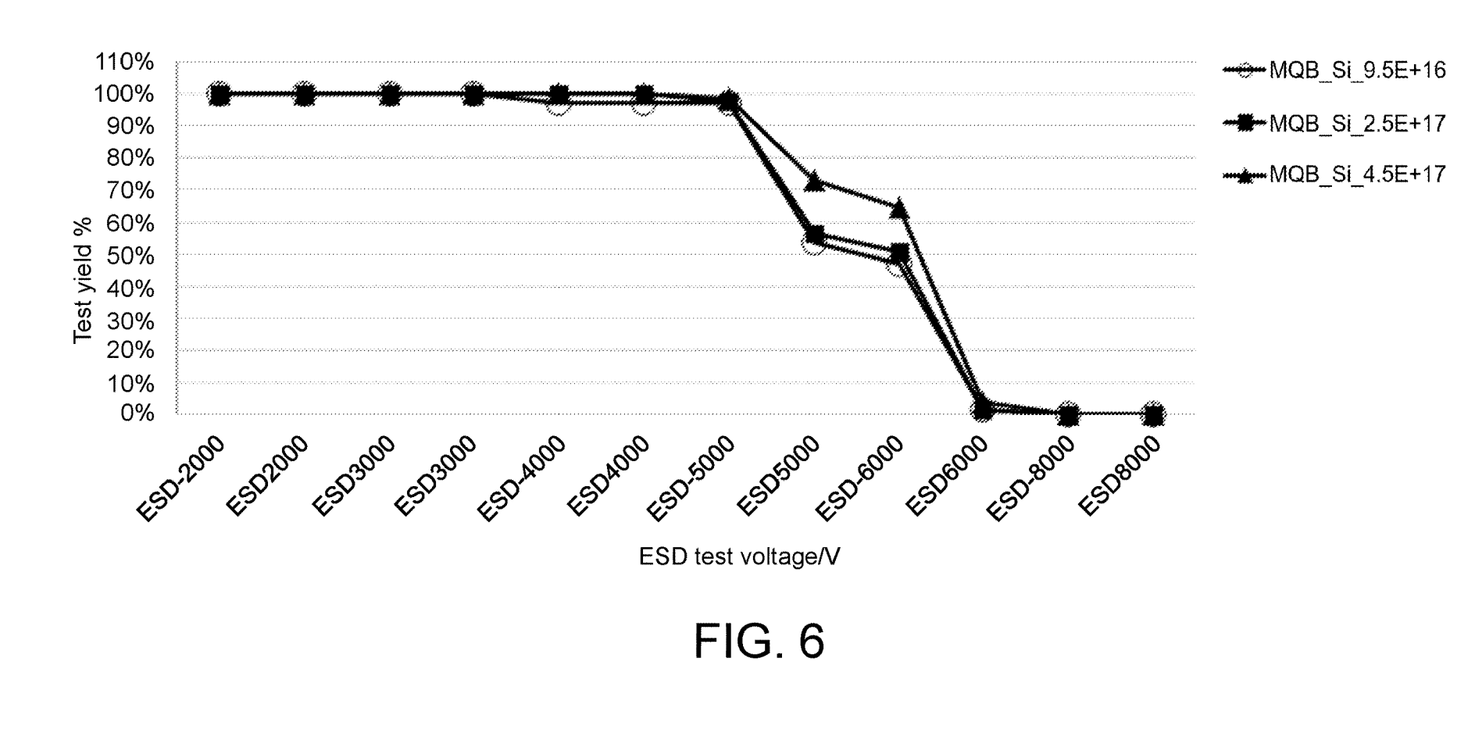
FIG. 6 illustrates a test yield-ESD test voltage curve comparison of the LED chips with a peak silicon doping concentration of 9.5E16 atoms/cm$^3$ in the all quantum barrier layers of the active layer close to the P-type semiconductor layer, the LED chips with a peak silicon doping concentration of 2.5E17 atoms/cm$^3$ in the all quantum barrier layers of the active layer close to the P-type semiconductor layer, and the LED chips with a peak silicon doping concentration of 4.5E17 atoms/cm$^3$ in the all quantum barrier layers of the active layer close to the P-type semiconductor layer in the embodiment of the disclosure.

Note that the epitaxial structures of the three LED flip-chip have different peak silicon doping concentration in all quantum barrier layers of the active layer; also the structures, materials, thicknesses, and doping concentration of other layers are the same as those of the LED epitaxial structure illustrated in Embodiment 2; and the electrodes and other structural designs of the flip chip are also the same.

As shown in FIG. 5, the flip-chip with the peak silicon doping concentration of 9.5E16 atoms/cm$^3$ and the flip-chip with the peak silicon doping concentration of 2.5E17 atoms/cm$^3$ of all the quantum barrier layers of the active layer are at the same voltage, and the corresponding capacitance is small, while the flip-chip with the peak silicon doping concentration of 4.5E17 atoms/cm$^3$ of all the quantum barrier layers of the active layer has large corresponding capacitance. When the corresponding voltage value is 2V, the capacitance has exceeded 5E-11 F.

As shown in FIG. 6, under the electrostatic voltage of 1 KV to 8 KV, the test yields of the three flip chips are not much different. Under the test voltages of ±2 KV to 5 KV, the test yields may reach 50% or more.

By analyzing the content, it can be seen that in Embodiment 2 of the disclosure, when the peak silicon doping concentration of all the quantum barrier layers of the active layer is no greater than 4E17 atoms/cm$^3$, and the capacitance of the flip chip is tested at 0-2V voltage, the capacitance does not exceed 5E-11 F, and the charge storage capacity is low. Meanwhile, compared with the other two chips, the test yield of the flip chip does not change much under the electrostatic voltage of 1 KV to 8 KV. Under the test voltage of ±2 KV to ±5 KV, the test yield can reach 50% or more, so the three flip-chips all have favorable antistatic properties.

In summary, in the LED epitaxial structure of the disclosure, the N-type doping concentration of at least two quantum barrier layers of the active layer is no greater than 4E17 atoms/cm$^3$. By reducing and controlling the N-type doping concentration in the active layer, the capacitance in the epitaxial structure is reduced, and the problem of display lag and dimming is solved when it is applied to backlight display.

The LED chip of the disclosure includes the LED epitaxial structure and has all the foregoing technical effects. Adopting the LED chip as the backlight source chip of the backlight module of the display device may effectively improve the problem of display lag and dimming.

What is claimed is:

1. An LED chip structure, comprising a semiconductor stack layer, wherein the semiconductor stack layer comprises:
   an N-type semiconductor layer;
   an active layer, disposed above the N-type semiconductor layer, wherein the active layer comprises multiple layers formed by repeatedly stacking a well layer and a quantum barrier layer;
   a P-type semiconductor layer, disposed above the active layer;
   wherein a superlattice layer is disposed between the N-type semiconductor layer and the active layer, the superlattice layer comprises a first superlattice layer and a second superlattice layer, the second superlattice layer is between the first superlattice layer and the active layer, N-type peak doping concentration of the second superlattice layer is less than N-type peak doping concentration of the first superlattice layer, N-type peak doping concentration of at least two quantum barrier layers of the active layer is no greater than 4E17 atoms/cm$^3$.

2. The LED chip structure according to claim 1, wherein N-type doping concentration of the at least two quantum barrier layers of the active layer is no less than 1E17 atoms/cm$^3$.

3. The LED chip structure according to claim 1, wherein the N-type peak doping concentration of more than half number of the quantum barrier layers is no greater than 4E17 atoms/cm$^3$.

4. The LED chip structure according to claim 1, wherein the N-type peak doping concentration of all the quantum barrier layers is no greater than 4E17 atoms/cm$^3$.

5. The LED chip structure according to claim 1, wherein the quantum barrier layer is an AlGaN layer or a GaN layer, and the well layer is an InGaN layer.

6. The LED chip structure according to claim 1, wherein the N-type peak doping concentration of the superlattice layer ranges from 1E17 atoms/cm$^3$ to 5E18 atoms/cm$^3$.

7. The LED chip structure according to claim 1, wherein the superlattice layer comprises repeated stack of InGaN/GaN.

8. The LED chip structure according to claim 1, wherein the N-type semiconductor layer comprises a first N-type GaN layer, and peak doping concentration of the first N-type GaN layer ranges from 5E18 atoms/cm$^3$ to 6E19 atoms/cm$^3$.

9. The LED chip structure according to claim 8, wherein a thickness of the first N-type GaN layer ranges from 1 µm to 10 µm.

10. The LED chip structure according to claim 8, wherein the N-type semiconductor layer further comprises a second N-type GaN layer, the second N-type GaN layer is disposed between the first N-type GaN layer and the superlattice layer, and the peak doping concentration of the first N-type GaN layer is greater than peak doping concentration of the second N-type GaN layer.

11. The LED chip structure according to claim 10, wherein the peak doping concentration of the second N-type GaN layer ranges from 1E18 atoms/cm$^3$ to 1E19 atoms/cm$^3$.

12. The LED chip structure according to claim 10, wherein the peak doping concentration of the second N-type GaN layer is greater than N-type peak doping concentration of the superlattice layer.

13. The LED chip structure according to claim 10, wherein, a third N-type GaN layer is disposed between the first N-type GaN layer and the second N-type GaN layer, and N-type peak doping concentration of the third N-type GaN layer is less than the peak doping concentration of the first N-type GaN layer and less than the peak doping concentration of the second N-type GaN layer.

14. The LED chip structure according to claim 13, wherein a fourth N-type GaN layer is disposed between the first superlattice layer and the second superlattice layer, and peak doping concentration of the fourth N-type GaN layer is greater than N-type peak doping concentration of the first superlattice layer and greater than N-type peak doping concentration of the second superlattice layer.

15. The LED chip structure according to claim 14, wherein a thickness of the third N-type GaN layer is greater than a thickness of the fourth N-type GaN layer.

16. The LED chip structure according to claim 10, wherein a fifth N-type GaN layer is disposed between the superlattice layer and the active layer, and doping concentration of the fifth N-type GaN layer is greater than N-type doping concentration of the superlattice layer.

17. The LED chip structure according to claim 16, wherein doping concentration of the fifth N-type GaN layer is greater than doping concentration of the second N-type GaN layer.

18. The LED chip structure according to claim 1, wherein P-type peak doping concentration of the P-type semiconductor layer ranges from 1E19 atoms/cm$^3$ to 1E20 atoms/cm$^3$.

* * * * *